United States Patent [19]

Nishizawa et al.

[11] Patent Number: 5,175,598
[45] Date of Patent: Dec. 29, 1992

[54] SEMICONDUCTOR SWITCHING DEVICE

[75] Inventors: Jun-ichi Nishizawa; Tadahiro Ohmi, both of Sendai, Japan

[73] Assignee: Zaidan Hojin Handotai Kenkyu Shinkokai, Sendai, Japan

[21] Appl. No.: 640,114

[22] Filed: Jan. 11, 1991

Related U.S. Application Data

[63] Continuation of Ser. No. 939,259, Dec. 5, 1986, Pat. No. 4,985,738, which is a continuation of Ser. No. 412,194, Aug. 27, 1982, abandoned, which is a continuation of Ser. No. 996, Jan. 3, 1979, abandoned.

[30] Foreign Application Priority Data

Jan. 6, 1978 [JP] Japan ................................. 53-740
Jan. 9, 1978 [JP] Japan ................................. 53-1408

[51] Int. Cl.$^5$ ..................... H01L 29/80; H01L 29/74; H01L 27/02
[52] U.S. Cl. .................................. 257/107; 257/136; 257/256; 257/264
[58] Field of Search .................. 357/22, 38, 58, 55, 357/41, 23.4, 59

[56] References Cited

U.S. PATENT DOCUMENTS 4,284,997 8/1981 Nishizawa ........................... 357/22
4,985,738 1/1991 Nishizawa et al. .................. 357/22

FOREIGN PATENT DOCUMENTS 52-036483 3/1977 Japan ................................. 357/22

OTHER PUBLICATIONS

T. Chiu, "Planar Junction-Gate Field Effect Transistor", IBM Tech. Discl. Bull., vol. 14 #1, Jun. 1976, p. 297.
J. Nishizawa et al., "Characteristics of New Thyristors", JJAP, vol. 16 (1977), Suppl 16-1, pp. 541-542.

Primary Examiner—Mark V. Prenty
Attorney, Agent, or Firm—Cushman, Darby & Cushman

[57] ABSTRACT

A semiconductor thyristor of the Static Induction type having a split-gate structure, e.g., driving gates and non-driving gates, for controlling cathode-anode current flow. The split-gate structure comprises a plurality of primary driving gates formed in recesses of the channel region which respond to an external control signal for providing primary current control, and a plurality of secondary non-driving gates which are influenced by electric fields in the channel region extant during thyristor operation for providing secondary current control. In operation, the driving and non-driving gates coact so that the non-driving gates, having an induced potential lower than the potential applied to the driving gates, absorb charge carriers injected in the channel during thyristor operation. The relative disposition of the non-driving gates and the anode, as well as the respective doping concentrations of the anode and channel regions, enable the non-driving gates to absorb a substantial portion of charge carriers injected from the anode into the channel during high-power operation. Fast turn-on and turn-off is achieved by exclusion of the non-driving gate capacitance in the driving gate circuit.

8 Claims, 10 Drawing Sheets

SEMICONDUCTOR SWITCHING DEVICE

This is a continuation of application Ser. No. 06/939,259 filed Dec. 5, 1986, now U.S. Pat. No. 4,985,738, which was a continuation of application Ser. No. 06/412,194 filed Aug. 27, 1982, now abandoned, which was a continuation of application Ser. No. 06/000,996 filed Jan. 3, 1979, abandoned.

BACKGROUND OF THE INVENTION a) Field of the Invention

The present invention relates to a semiconductor switching device, and more particularly to a split-gate type multi-channel static induction transistor.

b) Description of the Prior Art

The static induction transistor was first proposed by Jun-ichi NISHIZAWA, one of the present inventors. In the static induction transistor, current control can be performed by controlling the height of a potential barrier induced in front of the source in accordance with the voltages applied to the gate and to the drain, to thereby change the amount of the charge carriers injected from the source across the potential barrier into a current channel. In general, the static induction transistor, as is well known, has many advantages over conventional bipolar and unipolar transistors in such aspects as high transconductance, high blocking voltage, high operating speed, large current capacity and so on.

A junction static induction transistor can be used in two operational modes: normally-on (depletion) mode and normally-off (enhancement) mode. In a normally-off mode static induction transistor, the gate is forward-biased to turn the transistor on, and therefore a certain amount of minority carriers are injected from the gate into the channel. Such a carrier injection from the gate serves to promote the injection of carriers (majority carriers for the current channel) from the source into the current channel, which will lead to an increase in the transconductance as well as the current gain of the transistor. If an excessively large amount of minority carriers are injected from the gate into the channel, however, those carriers may cause an undesirable carrier storage effect in the current channel, which storage effect naturally obstructs the otherwise high speed operation of the transistor.

A static induction transistor eliminates carrier storage effect caused by excessive minority carriers injected from the gate into the current channel, has been disclosed by Jun-ichi NISHIZAWA in his U.S. Pat. No. 4,284,997. In this proposed static induction transistor, there is employed a split-gate structure which comprises a driving (or active) gate exclusively serving to control the carrier flow in the current channel in response to a control signal applied thereto, and a subsidiary non-driving (or passive) gate for absorbing carriers injected from the driving gate into the current channel.

SUMMARY OF THE INVENTION

It is a general object of the present invention to provide a semiconductor switching device which is capable of switching a large current at a high speed.

An object of the present invention is to provide a multi-channel static induction transistor with a split-gate structure, which is capable of providing an increased current capacity.

Another object of the present invention is to provide a new type of thyristor which contains a multi-channel static induction transistor as an essential part thereof for controlling the current flow.

Still another object of the present invention is to provide a thyristor of the type described above, which has a large current capacity, a high current gain, a high transconductance, and a high operating speed.

A further object of the invention is to provide a thyristor of the type described above, which has a high blocking voltage and a low holding voltage.

These and other objects, features and advantages of the present invention will be apparent by reading the following detailed description when taken in conjunction with the accompanying drawings.

DETAILED DESCRIPTION OF THE PREFERRED EMBODIMENTS

Figure 1:
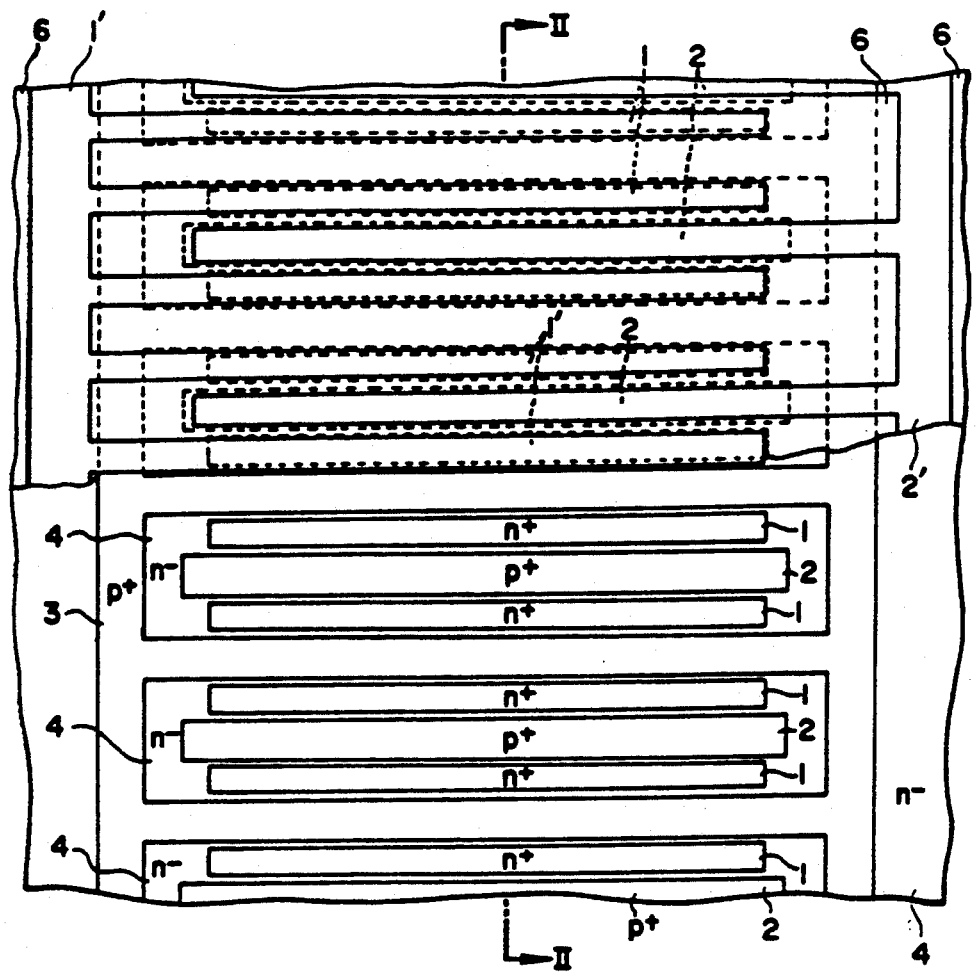
FIG. 1 shows a partially broken-away top plan view of an example of multi-channel static induction transistor according to the present invention.
Figure 2:
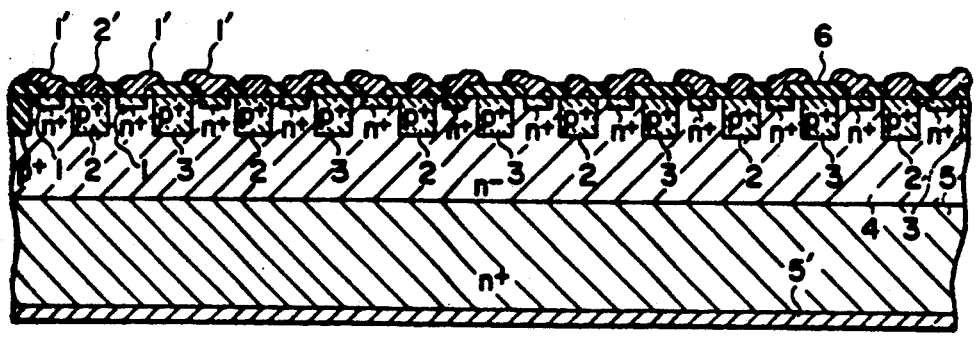
FIG. 2 is a vertical sectional view taken along the line II—II in FIG. 1.

An example of a semiconductor switching device according to the present invention is illustrated diagrammatically in top plan view in FIG. 1, and its vertical section taken along the line II—II in FIG. 1 is shown in FIG. 2. This switching device forms a multi-channel type static induction transistor with a split-gate structure, and comprises a semiconductor body, for example, of silicon. The semiconductor body is formed with a heavily doped n+ type semiconductor substrate 5 and a lightly doped n− type semiconductor layer 4, and this layer 4 contains therein a plurality of separate current channel regions. In the vicinity of the upper surface of the n− type semiconductor layer 4, there is disposed a heavily doped p+ type semiconductor region 3 which has a grid-like shape as shown in FIG. 1 so as to surround a plurality of individual portions of the n− type semiconductor layer 4. The grid-like shape p+ type region 3 is a common non-driving gate which is associated with all the separate current channels. In those portions of the n− type semiconductor layer 4 which are surrounded by the non-driving gate region 3 are provided heavily doped p+ type semiconductor regions 2 which serve as the driving gates for the respective current channels. These current channels are defined as those semiconductor regions of the n− type semiconductor layer 4 which are sandwiched between the non-driving gate region 3 and the driving gate regions 2. At the upper ends of the current channel regions, there are provided heavily doped n+ type semiconductor regions 1 which are operative as the source regions for the corresponding current channels, and these regions 1 are connected together in common by a source electrode 1'. The non-driving gate region 3 is provided with its own electrode 3' (not shown) which, however, may be connected to the source electrode 1'. The driving gate regions 2 are connected together by their own common electrode 2'. The n+ type semiconductor layer 5 is operative as a common drain region associated with each current channel, and is provided with its electrode 5'. These respective electrodes 1', 2', 3' and 5' may be formed with a metal such as aluminum, molybdenum or with a low resistivity (highly doped) polycrystalline silicon. Reference numeral 6 represents an insulator region formed with one or several laminated layers made of an insulator material such as silicon oxide ($SiO_2$), silicon nitride ($Si_3N_4$), or aluminum oxide ($Al_2O_3$), or a mixture of such insulator materials.

Usually, the source regions 1 have an impurity concentration ranging from $10^{18}$ to $10^{21}$ atoms/cm$^3$; the driving and non-driving gate regions 2 and 3, from $10^{16}$ to $10^{21}$ atoms/cm$^3$; the channel constituting the semiconductor layer 4, from $10^{11}$ to $10^{16}$ atoms/cm$^3$; and the drain region 5, from $10^{17}$ to $10^{20}$ atoms/cm$^3$. The channel width, i.e. the distance between the driving gate and the non-driving gate is dependent on such factors as the impurity concentration of the channel, the distance between the driving gate region and the non-driving gate region, the desired operational mode (normally-on or normally-off mode) of the device, and the potential at which the non-driving gate is to be held during the operation of the device. For a normally-off mode device in which the driving gate is given the same potential as that of the source, the channel width is determined so that each channel becomes pinched off by the depletion layers developed around the driving gate and the non-driving gate so as to generate a potential barrier for charge carriers (electrons in this case) near the source in the channel, and that the current path from the source through the channel to the drain is rendered non-conductive in the absence of the voltage application to the gate and to the drain. In general, the higher the impurity concentration in the channel is, the less the width of this channel is, because the width of the depletion layer is proportional to the square root of the voltage between the gate and the channel (including the diffusion potential established between the channel region and the driving or the non-driving gate region) and inversely proportional to the square root of the impurity concentration in the channel. The distance between the source and the drain is determined so that the transit time required for the carriers (electrons) to travel from the source to the drain may not prevent the desired high-speed operation of the device. When the device is required to attain a switching speed of one nano-second ($10^{-9}$ sec), for example, the source-drain distance may be 20 micrometers at most, i.e. it may be less than this value.

The operation of the device shown in FIGS. 1 and 2 will be explained below assuming that the device is of the normally-off mode.

When no voltage for forwardly biasing the driving gate regions is applied to the driving gate electrode, the potential barrier in each current channel will attain a height sufficient to prevent the passage of electrons therethrough, so that each current channel is in the non-conductive state. Namely, the device is in the turned-off condition. However, when a positive voltage (of the order of 0.4–0.7 volt or less in the case of silicon and of the order of 0.6–1.1 volt or less in the case of gallium arsenide) is applied to the driving gate electrode for forward biasing the driving gate regions, the depletion layers around the driving gate regions shrink, so that the height of the potential barrier in each current channel is reduced and/or a neutral (non-depleted) region appears in each current channel. Namely, the current channels are mode conductive, and therefore the device is caused to turn on.

More particularly, with an increase in the foward gate bias, firstly, the barrier height will decrease almost linearly to cause a fundamentally exponential increase in the drain current with an increase in the gate voltage, and then the neutral or neutral-like low barrier height region will appear whose width will, fundamentally, increase in proportion to the square-root of the gate voltage. In practical operation, these mechanisms work in a mixed manner, along with the minority carrier injection effect, as will be described below.

In the conductive state of the device (when the driving gate regions are forward-biased), a certain amount of minority carriers (holes in this case) are injected from the driving gate regions into the current channels. Those injected holes develop an electric field which will serve to promote the injection of the majority carriers (electrons in this case) from the source regions into the current channels as well as to lower the potential at the intrinsic gate in the channel.

In the device of the present invention, the gate is formed in the vicinity of the highly doped source region so as to reduce the source-to-intrinsic gate series resistance. This short source-to-gate structure brings about the further advantage that the effect of the injected minority carrier directly leads to an increase in the drain current. Namely, when a certain amount of the minority carriers is injected from the gate, a highly amplified amount of the majority carriers is induced from the source, and they travel through the intrinsic gate toward the drain. Such amplified drain current may be manifested in a kink in a semi-log scale drain current vs. gate voltage plots. Saturation of the minority and/or majority carrier injection leads to a saturation type drain current vs. gate voltage characteristic.

As a result, the device of the present invention will attain an extremely high current gain and also a high transconductance.

Furthermore, the smallness of the gate capacitance is enhanced by the division of the gate structure into a driving (active) gate and a non-driving (passive) gate. Only the gate capacitance of the driving gate relates to the switching speed. It is to be noted that the non-driving gate can be formed common to all the channels. In the example of FIGS. 1 and 2, the effective gate capacitance is at most half of the total gate capacitance (sum of the driving and non-driving gate capacitances). Furthermore, the device of the invention is capable of operating on large currents due to the multi-channel structure. On the other hand, the non-driving gate electrode is connected to a potential lower than that of the forward-biased driving gate regions, e.g. to the source electrode. Hence, the injected holes travel across the current channels, and then they are absorbed into the non-driving gate regions, so that the undesirable storage of holes in the current channels is prevented. Since the channel width is, generally, smaller than the diffusion length of holes in the current channels, such a hole absorption into the non-driving gate regions is performed extremely effectively. Therefore, when the forward biasing voltage applied to the driving gate electrode is removed, the injected holes in the current channels are quickly swept away into the non-driving gate regions and possibly into the driving gate regions. Thus, the device of the invention is substantially made free from the minority carrier storage effect while positively utilizing the minority carrier injection effect. The split-gate structure employed in the device according to the present invention apparently allows the dimension of the driving gate regions (which correspond to the total gate region in conventional devices) to be made small, and also allows the input capacitance measured at the driving gate electrode to be decreased. As such, the device of the present invention is capable of effecting switching actions at a highly increased speed.

Figure 3:
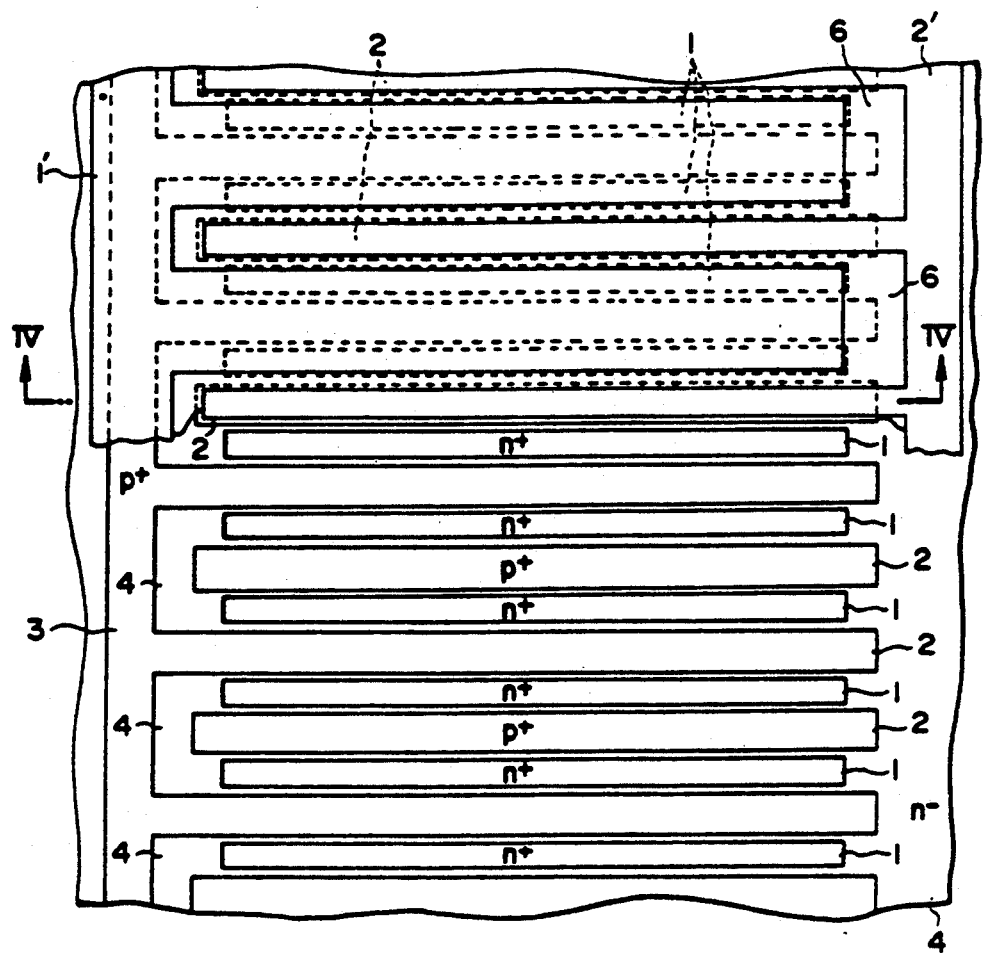
FIG. 3 shows a partially broken-away top plan view of another example of multi-channel static induction transistor embodying the present invention.
Figure 4:
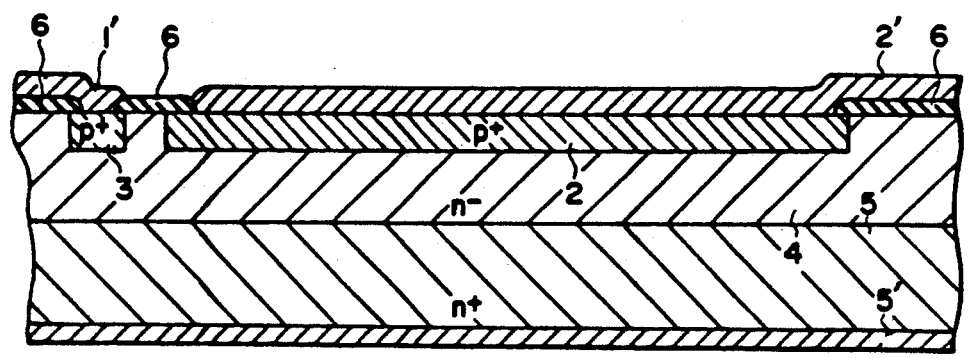
FIG. 4 is a vertical sectional view taken along the line IV—IV in FIG. 3.

A modification of the device shown in FIGS. 1 and 2 is shown in FIG. 3 in diagrammatic top plan view, and its vertical section taken along the line IV—IV in FIG. 3 is shown in FIG. 4. In this embodiment, the righthand part of the non-driving gate region 3 in FIG. 1 is omitted in FIG. 3 and the non-driving gate region 3 is formed to have a comb-like shape which comprises many teeth arranged at regular intervals for defining the current channel regions together with the driving gate regions 2. Such an arrangement of the non-driving gate region 3 is helpful to reduce the parasitic capacitance between the non-driving gate region 3 and the driving gate regions 2, not only by the reduction of the area of the non-driving gate but also by preventing the overlapping of the driving gate electrode on the non-driving gate region. Whereby, the input capacitance of the device is reduced. This will contribute to further increasing the operation speed of the device. In this embodiment, the non-driving gate region 3 is connected to the source electrode 1' as shown in FIG. 4. The operation and other aspects of this example are analogous to those of the previous embodiment shown in FIGS. 1 and 2.

Figure 5:
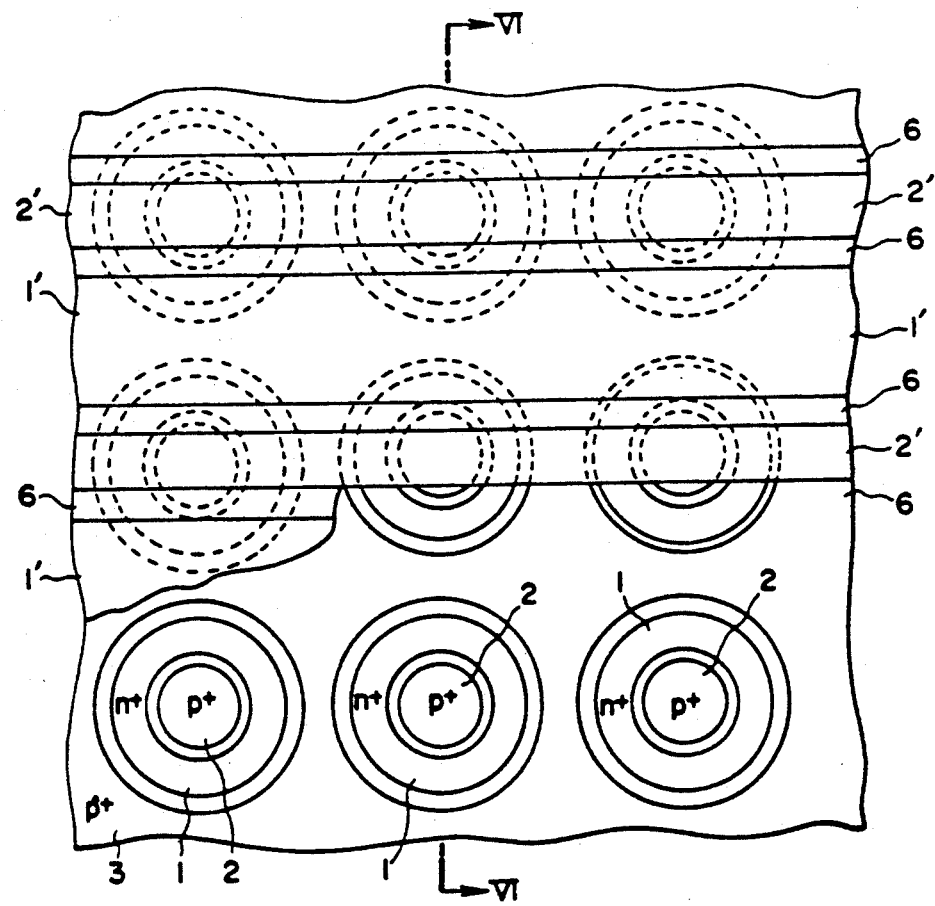
FIG. 5 shows a partially broken-away top plan view of still another example of multi-channel static inductin transistor according to the present invention.
Figure 6:
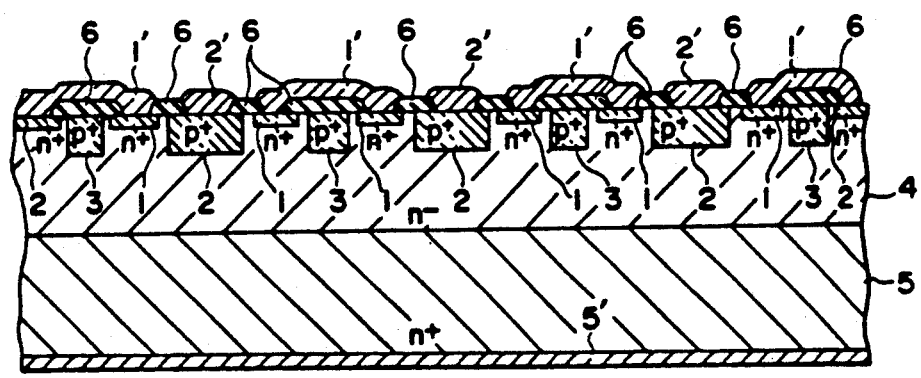
FIG. 6 is a vertical sectional view taken along the line VI—VI in FIG. 5.

Another modification of the device shown in FIGS. 1 and 2 is shown in FIG. 5 in diagrammatic top plan view, and its vertical section taken along the line VI—VI of FIG. 5 is shown in FIG. 6. In this embodiment, the non-driving gate region 3 covers substantially the whole of the upper surface portion of the n⁻ type semiconductor layer 4 and has many circular apertures for defining cylindrical current channel regions in the layer 4 in association with the driving gate regions 2. The respective source regions 1 are formed in an annular shape at the upper ends of the current channel regions. Such cylindrical current channel regions can be most effectively controlled by the small driving gate regions 2, allowing a minimized dimension of the driving gate regions 2 to be made for a required dimmension of the current channel regions. Accordingly, the instant embodiment of the invention is advantageous to attain a higher operational speed, a higher transconductance and an increased current gain. Moreover, it is possible to minimize the driving gate capacitance to a high degree, because of the minimized dimmension of the driving gate regions, and accordingly to provide a great increase in the operating speed of the device. Additionally speaking, the source electrode 1' faces the non-driving gate region 3 over a wide area via the insulator region 6, and may cause an increase in the capacitance between the non-driving gate region 3 and the source electrode 1'. It should be noted, however, that this increased capacitance does not obstruct to high speed operation of the device for the following reason. Namely, the non-driving gate electrode 3' is directly connected to the source electrode 1' or held at a fixed potential with respect to the source electrode 1'. Usually, the switching device is used in the so-called "common source configuration" wherein the source electrode 1' is grounded. Such an increased capacitance between the electrodes 1' and 3', therefore, does not have any adverse effect upon the switching operation of the device.

Figure 8:
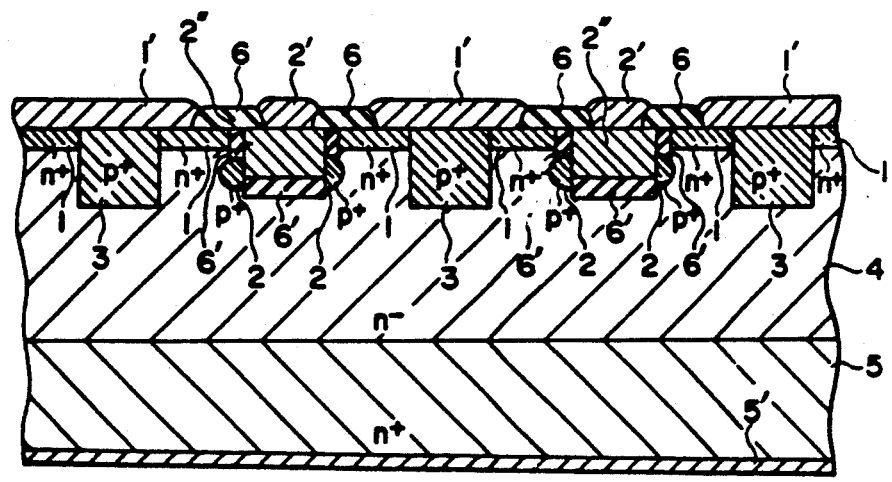
FIGS. 7 and 8 are vertical sectional views for illustrating further examples, respectively, of multi-channel static induction transistor according to the present invention.
Figure 7:
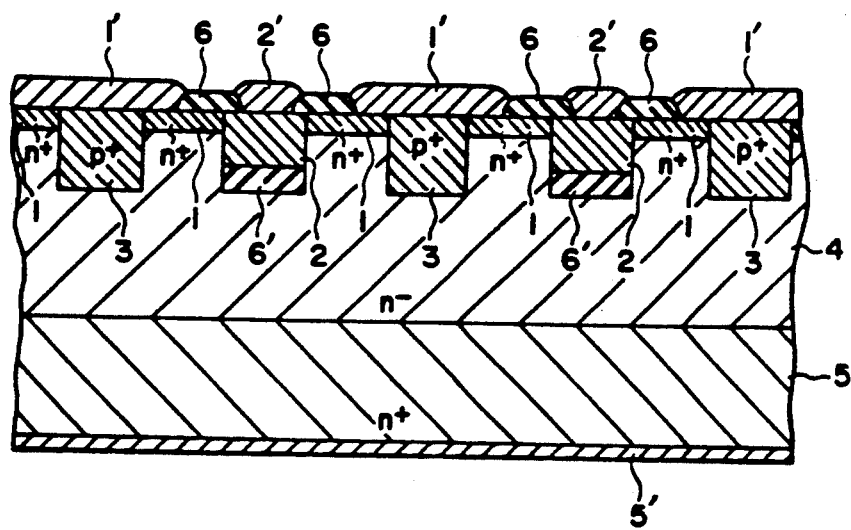

Other modifications of the device of the present invention are shown in FIGS. 7 and 8 in vertical sectional view.

In FIG. 7, an insulator region 6' is embedded beneath each driving gate region 2 for the purpose of preventing an undesirable injection of holes from the bottom portion of the driving gate region 2 into the n⁻ type semiconductor layer 4 and thereby to eliminate the non-effective minority carrier injection and the storage effect caused by such non-effective minority carriers. In this example, the driving gate region 2 may be formed with a highly-doped (low resistivity) polycrystalline silicon. The presence of the insulator region 6' also serves to decrease the driving gate capacitance, i.e. the input capacitance of the device measured at the driving gate electrode 2'. Thus, the driving gate arrangement shown in FIG. 7 is effective to attain a further increased operating speed of the device.

In the embodiment shown in FIG. 8, each driving gate region 2 is provided at a side wall portion of a recess formed in the layer 4, in such a way as to protrude toward the non-driving gate region 3 through an insulator region 6'. The respective driving gate regions 2 are connected to the electrode 2' by means of a conducting region 2'' filled in this recess, and this region 2'' is separated from the layer 4 by the insulator region 6'. With such a driving gate structure, it is possible to prevent an undesirable hole injection from the driving gate regions 2 into the non-effective part of the layer 4 excepting the current channel regions, and accordingly to eliminate the storage effect attributable to such undesirable hole injection. Furthermore, such a driving gate region 2 can be formed with a monocrystalline region, and can be easily formed into an extremely minute dimmension by, for instance, relying on the diffusion or ion-implantation technique applied through an aperture opened in the insulator or mask region 6'. The conducting region 2'' may be formed with a highly doped polycrystalline silicon. Accordingly, there can be obtained a great reduction in the driving gate capacitance, i.e. the input capacitance of the device. As a result, the instant embodiment of the present invention is quite advantageous in increasing the operating speed of the device with high reliability.

In FIGS. 7 and 8, the insulator region 6' may be formed with one or several laminated layers of an insulator material such as silicon oxide ($SiO_2$), silicon nitride ($Si_3N_4$) or aluminum oxide ($Al_2O_3$), or a combination thereof. The conducting region 2'' may be formed with a conducting material such as a low resitivity (doped) polycrystalline silicon, aluminum, or the like. It should be understood that, although the non-driving gate regions 3 are shown in FIGS. 7 and 8 as being connected to the source electrode 1', they may be provided with their own electrode which is separated from the source electrode 1'. It should be noted also that the driving gate regions 2 may be brought into direct contact with the source regions 1 in a manner as shown in FIG. 7. This is because the potential difference between the driving gate regions and the source regions can be varied in a range lower than about one volt in the usual operation of this inventive device where the driving gate regions are forward biased to turn on the device. In other words, the device of the present invention requires only such a small potential difference applied between the source and the driving gate regions to allow a required amount of current to flow into the device.

It will be apparent that the driving gate region and/or the non-driving gate region can also be completely isolated from the current channel by an insulator member when the advantageous effect of the minority carrier injection is not desired.

It will also be apparent that various combinations of the foregoing embodiments and the modifications thereof are within the scope of this invention.

According to another aspect of the present invention, there is provided a new type of thyristor that contains a multi-channel static induction transistor with a split-gate structure as an essential part thereof for controlling the flow of charge carriers. Hereunder will be described various examples of thyristor embodying the present invention.

Figure 9:
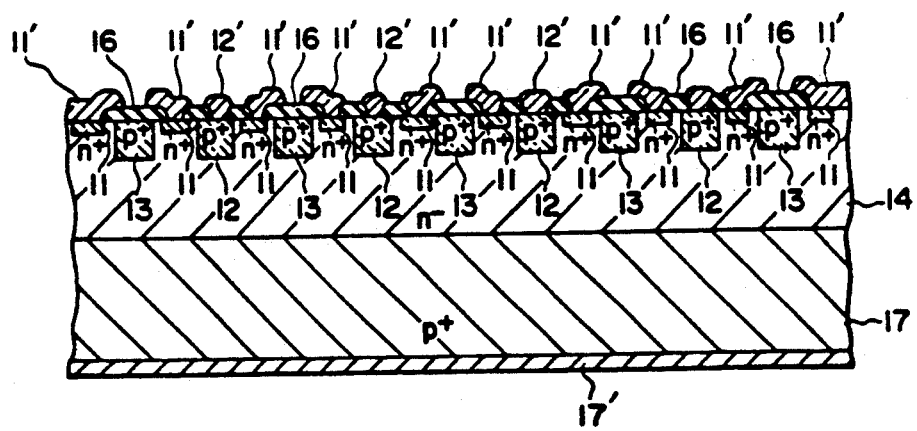
FIGS. 9 to 20 are vertical sectional views, respectively, of further modified examples of thyristor according to the present invention.

FIG. 9 is a vertical sectional view showing an example of a thyristor according to the present invention, which comprises a semiconductor body formed with a heavily doped $p^\times$ type semiconductor substrate 17 and a lightly doped $n^-$ type semiconductor layer 14 epitaxially grown on top of the substrate 17. In the $n^-$ type semiconductor layer 14, there are provided a heavily doped $p^+$ type semiconductor region 13 operative as a non-driving gate region, heavily doped $p^+$ type semiconductor regions 12 operative as driving gate regions, and heavily doped $n^+$ type semiconductor regions 11 operative as source (cathode) regions. The driving and non-driving gate regions are equivalent in function to those of a static induction transistor of the present invention described, in a preceding part of this specification, and they define separate current channel regions in the $n^-$ type semiconductor layer 14. Therefore, these regions may be formed in such plan-view shapes as those shown in FIGS. 1, 3 and 5. Similarly, the function of the cathode regions 11 is the same as that of the source regions in a static induction transistor of the present invention. The bottom portion of the $n^-$ type region 14 located adjacent to the $p^+$ type semiconductor layer 17, which is called an anode region, performs a function corresponding to that of the drain region in a static induction transistor. Such a quasi-drain region 14 and the anode region 17 jointly form a diode structure. When a sufficient amount of electrons is accumulated in this quasi-drain region, the injection of holes from the anode region 17 into the layer 14 occurs. The cathode, driving gate and anode regions 11, 12 and 17 are provided with their own electrodes 11', 12' and 17', respectively. The non-driving gate region 13 also has its electrode (not shown), which may be either connected to or separated from the cathode electrode 11'. Reference numeral 16 represents an insulator region made of an insulator material.

This thyristor may be constructed so as to operate either in the normally-off mode or the normally-on mode in accordance with the employed structure parameters such as the channel width and the impurity concentration of the respective semiconductor regions, particularly of the current channel regions. In the case of the normally-off mode, the thyristor is designed in such a manner that the current channel regions may remain non-conductive unless a required biasing voltage is applied for forwardly biasing the driving gate regions. For the normally-on mode, on the other hand, the thyristor is designed so that the current channel regions may be normally turned on in the conductive state, and turn off only when the driving gate regions are reverse-biased. For switching applications, it is preferable for a switching device to serve in the normally-off mode for the purpose of simplifying the power source (single polarity). Therefore, the operation of the thyristor of the present invention will hereinafter be explained, assuming that it is of the normally-off mode.

In case the driving gate electrode 12' is at a low potential, e.g. at the potential of the cathode electrode 11', the current channel regions are pinched off by the depletion layers formed around the driving and non-driving gate regions 12 and 13, and thus the thyristor remains in the turned-off state. When a positive potential (e.g. of the order of 0.4–0.7 volt for silicon; and of the order of 0.6–1.1 volt for gallium arsenide) with respect to the cathode electrode 11' is applied to the driving gate electrode 12' for forward-biasing the driving gate regions 12, a certain number of holes are injected from the driving gate regions 12 into the current channel regions, so that the channel regions are rendered conductive. These injected holes, when travelling across the channels toward the non-driving gate region 13, will develop an electric field which, in turn, will reduce the barrier height at the intrinsic gate and will assist the cathode regions 11 to inject electrons into the current channel regions. Accordingly, a large number of electrons are injected from the cathode regions 11 into the current channel regions and travel over the lowered barrier height. These electrons flow through the current channel regions to the anode region 17 to which a positive potential relative to the cathode regions 11 is applied. When such electrons are accumulated in the bottom portion of the $n^-$ type region 14 located adjacent to the anode region 17, the height of the barrier at the pn junction is lowered, and a sufficiently large amount of holes are injected from the anode region 17 into the layer 14 to switch-on the thyristor. Hence, the voltage drop between the cathode and anode electrodes is lowered to several volts or less. Thus, the thyristor of the present invention is capable of allowing the flow of a large current therethrough with only a very low holding voltage (as low as one volt or less) between the cathode and anode electrodes. In the turned-on state of the thyristor, almost all of the holes injected from the anode region 17 and reaching the cathode side are caused to flow into the non-driving gate region since it is at a lower potential as compared with the forward-biased driving gate regions, so that the driving current in the driving gate regions is limited to a low level.

The absorption of the holes by the non-driving and possibly by the driving gate regions keeps these gate regions forward-biased.

Thereafter, when the forward biasing voltage is removed, a potential barrier is established in the channel (at the intrinsic gate) again and the holes in the layer 14 containing the current channel regions are drawn mainly to the non-driving gate region while its potential is still lower than that of the driving gate regions. When the potential level of the driving gate region becomes the same as that of the non-driving gate region, the holes in the layer 14 will flow into both the driving and non-driving gate regions. The ratio of the amount of holes flowing to the driving gate regions and to the non-driving gate region is dependent mainly on the dimension ratio thereof. Since, however, the driving gate regions are usually smaller than with the non-driving gate region, the amount of holes flowing into the driving gate regions i.e. the amount of current flowing in the driving gate regions is restricted to a sufficiently low level. If the non-driving gate region is reverse biased and is always at a lower potential than the driving gate, the minority carriers from the anode naturally will always flow mostly into the non-driving gate region.

It should be seen that the thyristor of the present invention has the same advantages represented by small input capacitance, high switching speed, large current capacity, large current gain, and so forth, owing to the split-gate structure as in case of a static induction transistor according to the present invention.

Alternatively, it is often desirable for a thyristor to have as high a forward blocking voltage as possible. For achieving this purpose, the potential barrier to be established in the channel (at the intrinsic gate) is preferably as high as possible in the switched-off state. This can be easily achieved by reverse biasing the gate, as well as by decreasing the impurity concentration and by increasing the thickness of the channel region and the region between the intrinsic gate and the anode region (in this example).

In all these cases, the potential of the driving gate region may be held at a potential lower than the triggering voltage as well as at the potential same as the triggering voltage.

Preferable modifications of the thyristor shown in FIG. 9 will now be explained by referring to FIGS. 10 to 14.

Figure 10:
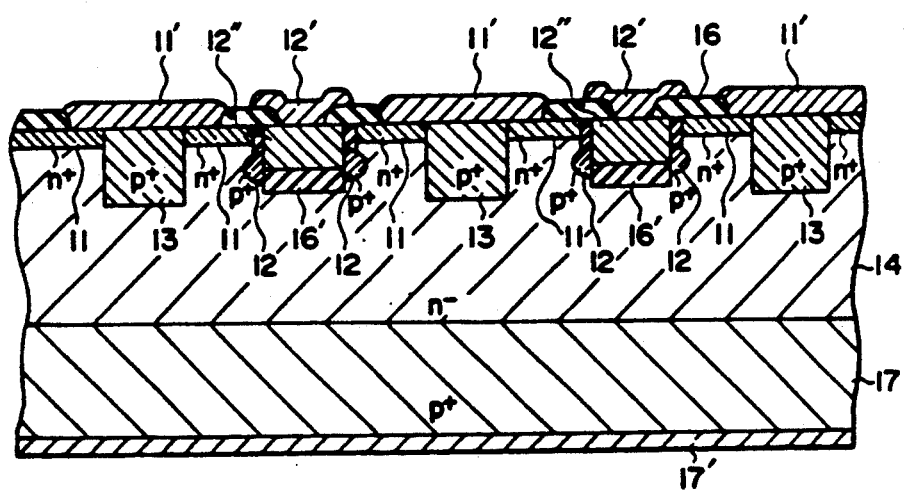
Figure 11:
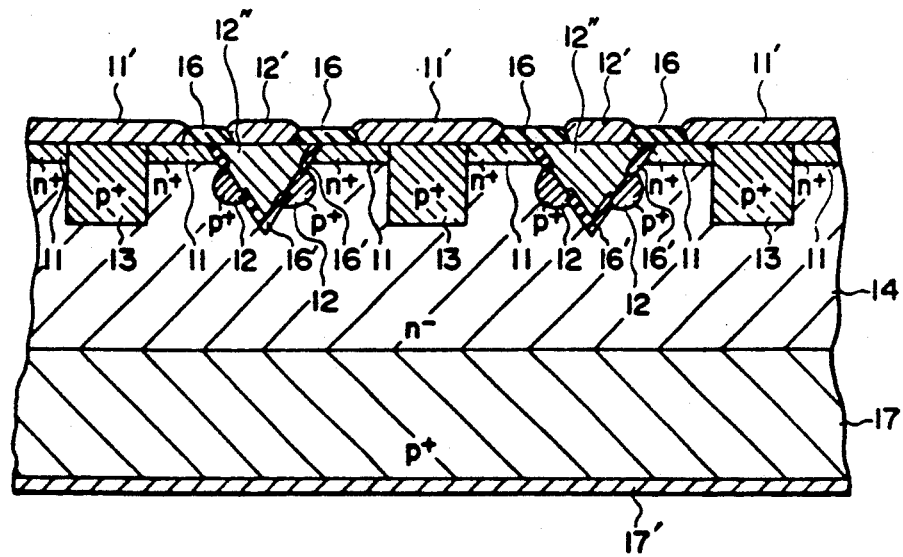

In the respective embodiments shown in FIGS. 10 and 11, each driving gate region 12 is provided at a wall portion of a recess which is formed in the layer 14 and has a rectangular or triangular cross section, in such a manner as to protrude toward the non-driving gate region 13, and an insulator region 16' is provided at the bottom portion of this recess similar to the examples of the switching transistor shown in FIGS. 7 and 8. Such a driving gate region 12 can be readily formed with extremely minute dimension, so that a great reduction in the driving current which flows when the thyristor is turned off can be achieved. In the instant embodiments, the driving gate regions 12 are connected to the electrode 12' via a conducting region 12''.

Figure 12:
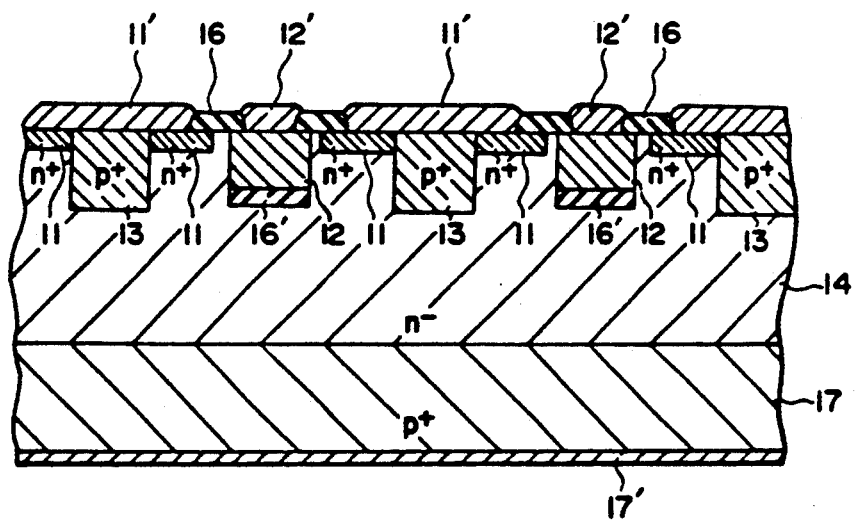

In FIG. 12, the driving gate regions 12 are made with a p+ type polycrystalline silicon, and their bottom surfaces are covered with insulator regions 16' for preventing the flow thereinto of holes injected from the anode region 17.

Figure 13:
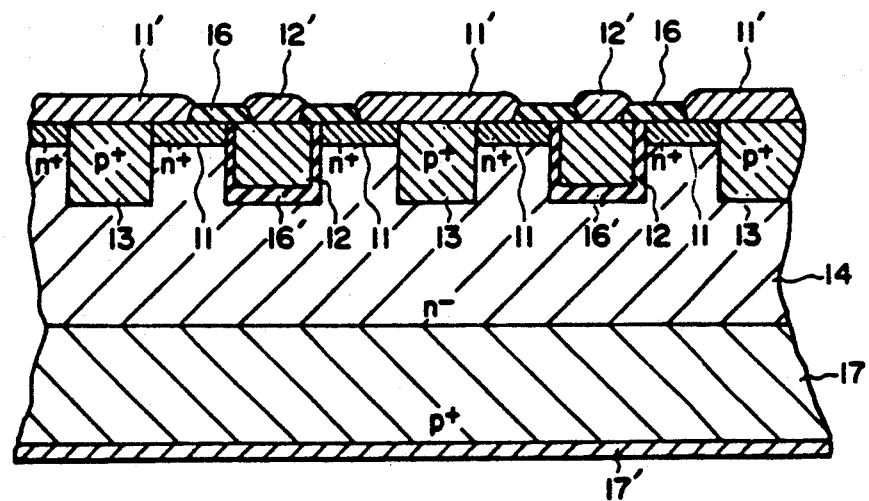
Figure 14:
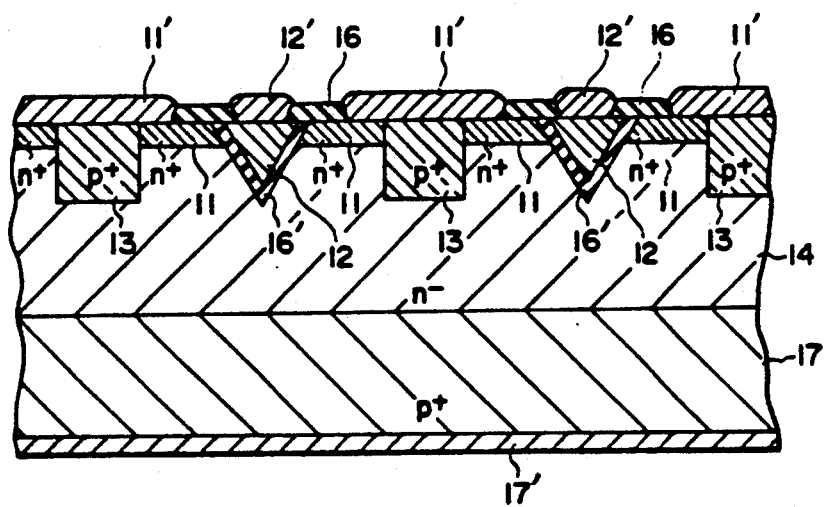

In the embodiments shown in FIGS. 13 and 14, the driving gate is constructed in the form of an insulated gate structure in which each driving gate region 12 is entirely covered with an insulator or an oxide region 16'. The driving gate region 12 is formed with a conducting material, such as p+ type low resitivity polycrystalline silicon, aluminum, molybdenum or the like, or a combination thereof. With such a driving gate structure, the flow of holes into the driving gate region is almost completly prevented, so that the driving gate current flowing at turning-off of the device can be reduced to a great extent.

With the arrangements of thyristor as shown in FIGS. 9 to 14, the extraction of electrons out of the anode region may require a relatively long time, which may become an obstruction in obtaining a desirable high speed turning-off of the device. Such a problem can be effectively obviated in the following examples of a thyristor according to the present invention, which will hereunder be explained with reference to FIGS. 15 to 20.

Figure 15:
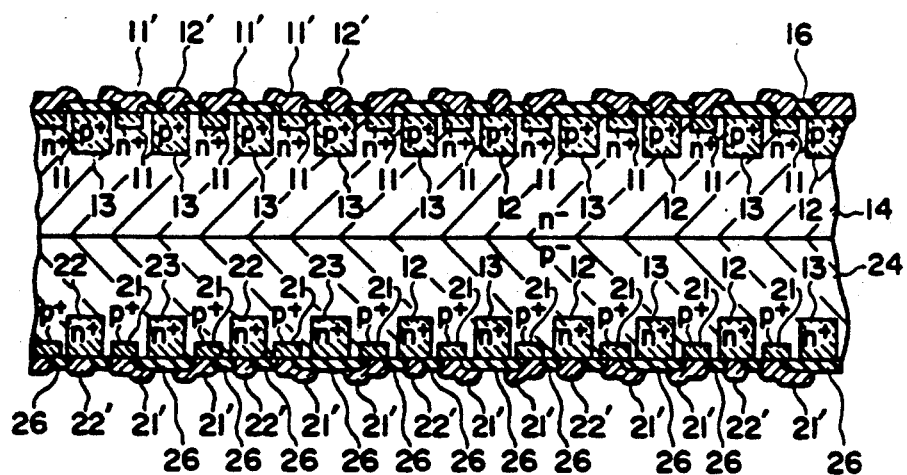

The thyristor shown in FIG. 15 comprises a semiconductor substrate consisting of a lightly doped p− type semiconductor layer 24 and a lightly doped n− type semiconductor layer 14. In the vicinity of the upper surface of the layer 14, there are provided n+ type cathode regions 11, p+ type driving gate regions 12 and p+ type non-driving gate regions 13. Similarly, p+ type anode regions 21, n+ type driving gate regions 22 and an n+ type non-driving gate region 23 are provided in the vicinity of the bottom surface of the layer 24. As can be easily seen, the present embodiment of thyristor is made up essentially of a combination of a first multi-channel static induction transistor of N-channel type which is formed in the n− type semiconductor layer 14, and a second multi-channel static induction transistor of P-channel type which is constructed in the p− type semiconductor layer 24. The plan view of both the upper and the bottom surfaces of the semiconductor body may be shown as illustrated in FIGS. 1, 3 and 5. Reference numerals 11', 12' and 16 represent electrodes for the regions 11 and 12, and an insulator region respectively. Similarly, reference numerals 21', 22' and 26 represent electrodes for the regions 21 and 22, and an insulator region, respectively. The non-driving gate regions 13 and 23 are also provided with their own electrodes (not shown), which may be directly connected to the electrodes 11' and 21', respectively.

In using this thyristor, the anode electrode 21' is given a positive potential with respect to the cathode electrode 11', and the non-driving gate electrodes are held, for instance, at the same potential as those of the cathode and anode electrodes 11' and 21', respectively. When the driving gate regions of both the first and second static induction transistors are in the reverse-biased condition, the current channel regions of these two transistors are caused to be rendered non-conductive. Thus, the device remains in its turned-off state. On the other hand, when supplying the driving gate electrode 12' with a positive potential with respect to the cathode electrode 11' for forward-biasing the driving gate regions 12, and when supplying the driving gate electrode 22' with a negative potential with respect to the anode electrode 21' for forward-biasing the driving gate regions 22, the current channel regions of both the first and second static induction transistors are caused to be turned conductive. Namely, the thyristor is turned on. In this state, the injection of a large amount of electrons and holes from the cathode and anode regions 11 and 21 occur, so that the holding voltage between the cathode electrode 11' and the anode electrode 21' is reduced to a very low level. The injected holes and electrons are entirely attracted to and drawn into the non-driving gate regions 13 and 23 rather than toward the driving gate regions, and, as a result, the driving gate currents are limited to a low level.

It should be noted that the instant embodiment can provide a very high speed operation owing to the dual split-gate structure.

Other examples of a thyristor according to the present invention are shown in FIGS. 16 to 20, which have simpler structure than that of the previous embodiment shown in FIG. 15 in that they have only one driving gate electrode and can be used in a simpler circuit arrangement.

Figure 16:
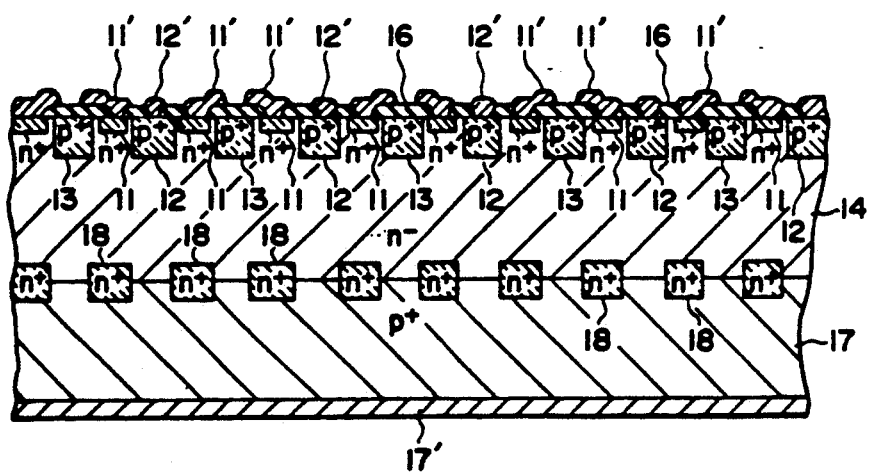

In FIG. 16, heavily doped n+ type semiconductor regions 18 are embedded at the boundary region between the layers 14 and 17. These regions 18 may be formed into a single continuous region having a stripe, mesh or grid-like shape, and may be connected to the anode electrode 17' through some resistive and/or conducting means (not shown) or floated. The n+ type regions 18 serve to absorb electrons. The number of these n+ type regions may be reduced so that one n+ type region 18 corresponds to more than one source region. Otherwise, the arrangement is analogous to that of the previous embodiment shown in FIG. 9. In the turned-on state of the device, the electrons injected from the cathode regions 11 are drawn mainly into the n+ type regions 18, so that excessive injection of electrons into the anode region 17 can be prevented. Moreover, when the device is turned off, the electrons in the anode region 17 as well as those in the layer 14 are effectively absorbed and quickly swept away into the n+ type regions 18. Thus, the instant embodiment of tyristor is capable of operating at an extremely high speed. Additionally speaking, the n+ type regions 18 may be given their own electrode which is separated from the anode electrode 17'. It should be understood that this device can achieve such advantages due to the split-gate structure as obtained in a static induction transistor of the present invention.

Figure 17:
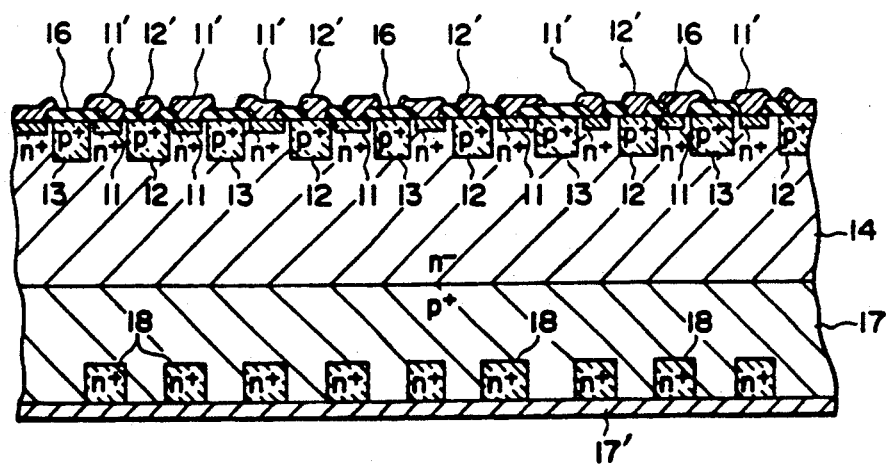
Figure 18:
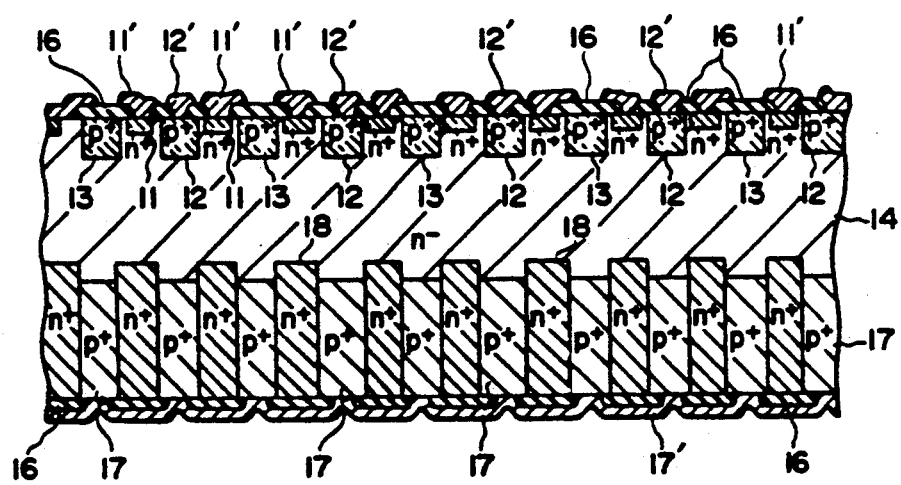

The n+ type regions 18 in FIG. 16 may be modified into such fashion as shown in FIGS. 17 and 18. In FIG. 17, the n+ type regions 18 are disposed in the vicinity of the bottom surface of the anode region 17 and are brought into contact with the anode electrode 17'. In FIG. 18, the n+ type regions 18 are provided in the substrate in such a manner that they partially protrude into the n− type layer 14.

Figure 19:
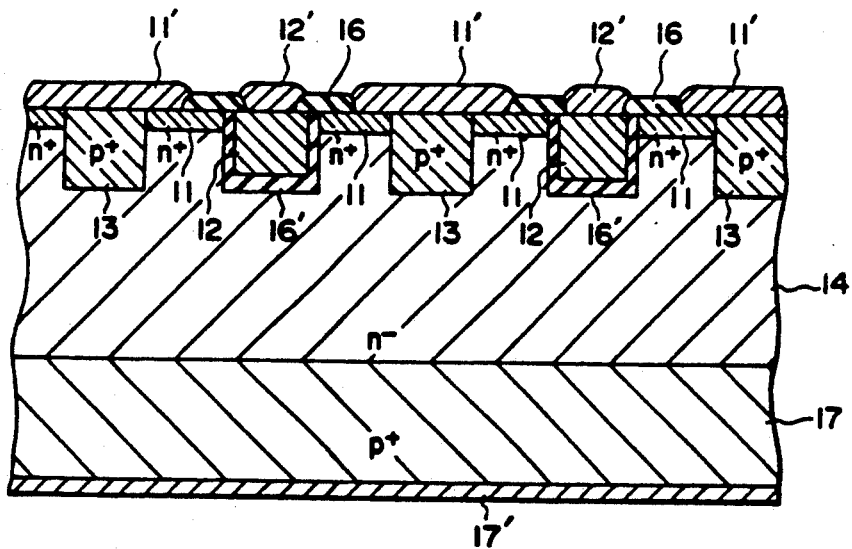

In FIG. 19 is shown a modification of the thyristor shown in FIG. 16, in which the driving gate is constructed in the form of an insulated-gate structure. Namely, the driving gate region 12 is insulated from the n− type layer 14 containing the current channel regions by an insulator region 16'. The driving gate region 12 is made with aluminum, molybdenum, low resistivity (highly doped) polycrystalline silicon, or the like. With this arrangement, there can be obtained a great reduction in the driving gate current, which in turn leads to an extremely high current gain and a high turn-off time.

Figure 20:
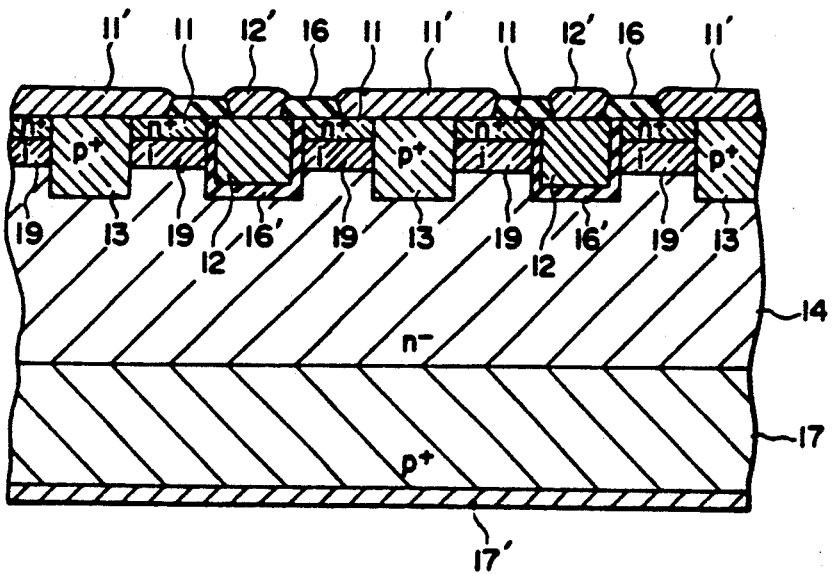

General requirements of a thyristor include high blocking voltage in addition to high current gain, high speed switching of a large current and low holding voltage. An embodiment of a thyristor according to the present invention is shown in FIG. 20, in which intrinsic (i type) semiconductor regions 19 are provided in front of the respective cathode regions 11 for the purpose of increasing the height of potential barriers induced in the current channel regions, thereby increasing the blocking voltage of the device. This thickened i type region 19 will provide a higher blocking voltage. However, an excessive thickness of the i type regions 19 will cause an increase in the holding voltage of the device. As such, the thickness of the regions 19 should be determined so as to meet simultaneously both the blocking and holding voltage requirements. In general, if the thickness of the regions 19 is less than the diffusion length of electrons or holes in these regions, the provision of the i type regions 19 will hardly bring about any increase in the holding voltage. The intrinsic regions 19 may be replaced by such π type (high resistivity p type, or nearly intrinsic p type) semiconductor regions which are almost depleted by the built-in potentials. It should be noted, needless to say, that such intrinsic or π type semiconductor regions may be introduced into the previous embodiments shown in FIGS. 10 to 19.

Although preferred embodiments of the invention have been described herein, it should be obvious to those skilled in the art that the present invention may be carried out in various ways and may take various forms of embodiments other than those described above as well as the combinations of the foregoing embodiments. Accordingly, it should be understood that the present invention is not limited to the details of the foregoing description but is defined by the appended claims. For example, the semiconductor material used may be any one of silicon, germanium, III–V compounds, II–VI compounds and other semiconductors. Also, the respective semiconductor regions or layers, as a whole, may be inverted in their conductivity type. Moreover, the insulator material is not limited to those described above. Furthermore, the shape of the channel regions is not limited to those depicted in the drawings.

What is claimed is:

1. A split-gate type multi-channel static induction transistor comprising:

a high impurity concentration layer made to be used as a n+ type drain layer, an n− type semiconductor layer having high resistance formed adjacent to said high impurity concentration layer, a plurality of separate source regions, each having high impurity concentration including an n+ type layer and each disposed in the vicinity of a principal surface of said n− type semiconductor layer opposite with the surface contacting with said high impurity concentration layer, a plurality of separate gate regions, each having high impurity concentration consisting of a p+ type layer and each disposed in the vicinity of the principal surface of said n− type semiconductor layer, first and second current carrying electrode means, and a plurality of current-path-providing semiconductor regions for providing a plurality of separate current paths between said first and second current carrying electrode means, one side of each said gate region surrounding each said source region having an ohmic electrode attached thereto to use as a driving gate electrode and the other side being connected to said source region to use as a non-driving gate, an area of said driving gate being smaller than an area of said non-driving gate, said driving gate being associated with each of said current-path-providing semiconductor regions for developing, in each of said current-path-providing semiconductor regions, a depletion layer with a width responsive to a controlling signal applied to the driving gate and thereby controlling current flow in each of said current paths in response to said controlling signal, and said non-driving gate forming, in each of said current-path-providing semiconductor regions, another depletion layer with a width responsive to a potential of the non-driving gate to thereby concurrently define each of said current paths in said current-path-providing semiconductor regions together with said driving gate.

2. A split-gate type multi-channel static induction transistor according to claim 1, wherein said driving gate includes a recess in said n⁻ type semiconductor layer and a p⁺ type region at a wall portion of said recess, and further comprising an insulator region provided at the bottom portion of said recess, an electrode connected to said driving gate via a conducting region, said p⁺ type region of said non-driving gate contacting said n⁺ type source region, and a cathode electrode provided commonly on surfaces of said n⁺ type source region and said p⁺ type region of said non-driving gate.

3. A split-gate type multi-channel static induction transistor according to claim 2, wherein said recess has a rectangular or triangular cross section.

4. A split-gate type multi-channel static induction transistor according to claim 1, wherein said driving gate is made with a p⁺ type polycrystalline silicon.

5. A split-gate type multi-channel static induction transistor comprising:

a high impurity concentration layer made to be used as a n⁺ type drain layer, an n⁻ type semiconductor layer having high resistance formed adjacent to said high impurity concentration layer, a plurality of separate source regions each having high impurity concentration including an n⁺ type layer and each disposed in the vicinity of a principal surface of said n⁻ type semiconductor layer opposite to a surface contacting said high impurity concentration layer, a plurality of separate gate regions, each having high impurity concentration including a p⁺ type layer and each disposed in the vicinity of the principal surface of said n⁻ type semiconductor layer, first and second current carrying electrode means, and a plurality of current-path-providing semiconductor regions for providing a plurality of separate current paths between said first and second current carrying electrode means, one side of each said gate region surrounding each said source region having an ohmic electrode attached thereto to use as a driving gate and the other side being kept under a fixed potential to use as a non-driving gate, an area of said driving gate being smaller than that of said non-driving gate, said driving gate being associated with each of said current-path-providing semiconductor regions for developing, in each of said current-path-providing semiconductor regions, a depletion layer with a width complying with a controlling signal applied to the driving gate and thereby controlling current flow in each of said current paths in response to said controlling signal, and said non-driving gate forming, in each of said current-path-providing semiconductor regions, another depletion layer with a width complying with a potential of the non-driving gate to thereby concurrently define each of said current paths in said current-path-providing semiconductor regions together with said driving gate.

6. A split-gate type multi-channel static induction transistor according to claim 5, wherein said driving gate includes a recess in said n⁻ type semiconductor layer and a p⁺ type region at a wall portion of said recess, and further comprising an insulator region provided at the bottom portion of said recess, an electrode is connected to said driving gate via a conducting region, said p⁺ type region of said non-driving gate is contacted said n⁺ type source region, and a cathode electrode is provided commonly on the surfaces of said n⁺ type source region and said p⁺ type region of said non-driving gate.

7. A split-gate type multi-channel static induction transistor according to claim 6, wherein said recess has a rectangular or triangular cross section.

8. A split-gate type multi-channel static induction transistor according to claim 5, wherein said driving gate is made with a p⁺ type polycrystalline silicon.

* * * * *

UNITED STATES PATENT AND TRADEMARK OFFICE
CERTIFICATE OF CORRECTION

PATENT NO. : 5,175,598

DATED : December 29, 1992

INVENTOR(S) : NISHIZAWA et al.

It is certified that error appears in the above-identified patent and that said Letters Patent is hereby corrected as shown below:

On the title page, Item [63]:

Under "Related U.S. Application Data", first line, change "Continuation" to --Division--

Signed and Sealed this

Seventh Day of December, 1993

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,175,598

DATED : December 29, 1992

INVENTOR(S) : NISHIZAWA et al.

It is certified that error appears in the above-identified patent and that said Letters Patent is hereby corrected as shown below:

IN THE ABSTRACT:

Line 1, change "thyristor" to --transistor--;

Line 9, change "extant" to --extend--; and delete "thy-";

Line 10, delete "ristor"; and insert --transistor--;

Line 15, change "thyristor" to --transistor--;

Lines 16 and 17, change "anode" to --drain--;

Line 19, change "anode" to --source--.

Signed and Sealed this

Eleventh Day of January, 1994

Attest:

BRUCE LEHMAN

Attesting Officer     Commissioner of Patents and Trademarks